US010339265B2

(12) United States Patent
Fricke

(10) Patent No.: US 10,339,265 B2
(45) Date of Patent: Jul. 2, 2019

(54) METHOD AND SYSTEMS FOR OFF-LINE CONTROL FOR SIMULATION OF COUPLED HYBRID DYNAMIC SYSTEMS

(71) Applicant: MTS Systems Corporation, Eden Prairie, MN (US)

(72) Inventor: David M. Fricke, Prior Lake, MN (US)

(73) Assignee: MTS SYSTEMS CORPORATION, Eden Prairie, MN (US)

(*) Notice: Subject to any disclaimer, the term of this patent is extended or adjusted under 35 U.S.C. 154(b) by 239 days.

(21) Appl. No.: 15/332,106

(22) Filed: Oct. 24, 2016

(65) Prior Publication Data

US 2017/0039313 A1 Feb. 9, 2017

Related U.S. Application Data

(60) Division of application No. 13/857,300, filed on Apr. 5, 2013, now Pat. No. 9,477,793, which is a (Continued)

(51) Int. Cl.
*G01M 17/02* (2006.01)
*G01M 17/04* (2006.01)
(Continued)

(52) U.S. Cl.
CPC ....... *G06F 17/5095* (2013.01); *G01M 17/007* (2013.01); *G01M 17/0074* (2013.01);
(Continued)

(58) Field of Classification Search
CPC .. G01M 17/007; G01M 17/27; G01M 13/025; G06F 17/5095; G05B 23/0256
See application file for complete search history.

(56) References Cited

U.S. PATENT DOCUMENTS 3,592,545 A 7/1971 Paine et al.
3,597,967 A 8/1971 Drexler et al.
(Continued)

FOREIGN PATENT DOCUMENTS

CN 102227622 A 10/2011
DE 2728007 B1 8/1978
(Continued)

OTHER PUBLICATIONS

Japanese Office Action from Japanese Patent Application No. 2016-501459, dated Oct. 31, 2017.
(Continued)

*Primary Examiner* — Michael J Dalbo
(74) *Attorney, Agent, or Firm* — Steven M. Koehler; Westman, Champlin & Koehler, P.A.

(57) ABSTRACT

Systems and methods are provided for controlling the simulation of a coupled hybrid dynamic system. A physical test rig configured to drive the physical structure component of the system and to generate a test rig response as a result of applying a test rig drive signal. A processor is configured with a virtual model of a complementary system to the physical structure component. The processor receives the test rig response and generates a response of the complementary system based on a received test rig response. The system can be driven with a random input. The processor compares the test rig response with the response of the complementary system, the difference being used to form a system dynamic response model.

4 Claims, 11 Drawing Sheets

Related U.S. Application Data continuation-in-part of application No. 13/416,150, filed on Mar. 9, 2012, now abandoned, which is a continuation of application No. 12/244,597, filed on Oct. 2, 2008, now Pat. No. 8,135,556.

(51) Int. Cl.
 *G06F 17/50* (2006.01)
 *G01M 17/007* (2006.01)
(52) U.S. Cl.
 CPC .......... *G01M 17/027* (2013.01); *G01M 17/04* (2013.01); *G06F 17/5009* (2013.01)

(56) References Cited

U.S. PATENT DOCUMENTS

| | | | |
|---|---|---|---|
| 3,818,751 A | 6/1974 | Karper et al. | |
| 3,939,692 A | 2/1976 | Bolliger | |
| 4,882,677 A | 11/1989 | Curran | |
| 5,014,719 A | 5/1991 | Mc Leod | |
| 5,038,605 A | 8/1991 | Tews | |
| 5,101,660 A | 4/1992 | La Belle | |
| 5,168,750 A | 12/1992 | Kurtz | |
| 5,259,249 A | 11/1993 | Fetto | |
| 5,277,584 A | 1/1994 | DeGroat | |
| 5,369,974 A | 12/1994 | Tsymberov | |
| 5,430,645 A | 7/1995 | Keller | |
| 5,450,321 A | 9/1995 | Crane | |
| 5,487,301 A | 1/1996 | Ueller et al. | |
| 5,511,431 A | 4/1996 | Hinton | |
| 5,541,504 A | 7/1996 | Kubo et al. | |
| 5,598,076 A | 1/1997 | Neubauer | |
| 5,602,759 A | 2/1997 | Harashima | |
| 5,821,718 A | 10/1998 | Shaffer | |
| 5,877,414 A | 3/1999 | Rui | |
| 5,880,362 A | 3/1999 | Tang | |
| 5,936,858 A | 8/1999 | Arai | |
| 5,937,530 A | 8/1999 | Masson | |
| 5,942,673 A * | 8/1999 | Horiuchi | G01M 17/007 73/11.04 |
| 5,952,582 A | 9/1999 | Akita | |
| 5,959,215 A | 9/1999 | Ono et al. | |
| 5,999,168 A | 12/1999 | Rosenberg | |
| 6,044,696 A | 4/2000 | Spencer-Smith | |
| 6,105,422 A | 8/2000 | Pollock | |
| 6,134,957 A * | 10/2000 | Fricke | G01M 17/022 73/146 |
| 6,141,660 A | 10/2000 | Zyburt | |
| 6,171,812 B1 | 1/2001 | Smith | |
| 6,192,745 B1 | 2/2001 | Tang | |
| 6,234,011 B1 | 5/2001 | Yamagishi | |
| 6,247,348 B1 * | 6/2001 | Yamakado | G01M 17/045 73/11.04 |
| 6,285,972 B1 * | 9/2001 | Barber | G01M 7/022 318/561 |
| 6,418,392 B1 | 7/2002 | Rust et al. | |
| 6,502,837 B1 | 1/2003 | Hamilton et al. | |
| 6,510,740 B1 | 1/2003 | Behm et al. | |
| 6,538,215 B2 | 3/2003 | Montagnino et al. | |
| 6,571,373 B1 | 5/2003 | Devins et al. | |
| 6,581,437 B2 | 6/2003 | Chrystall et al. | |
| 6,634,218 B1 | 10/2003 | Nakanishi et al. | |
| 6,715,336 B1 | 4/2004 | Xu | |
| 6,721,922 B1 | 4/2004 | Walters et al. | |
| 6,725,168 B2 | 4/2004 | Shiraisi et al. | |
| 6,754,615 B1 | 6/2004 | Germann et al. | |
| 6,898,542 B2 | 5/2005 | Ott et al. | |
| 6,962,074 B2 | 11/2005 | Lenzen et al. | |
| 7,031,949 B2 | 4/2006 | Lund | |
| 7,058,488 B2 | 6/2006 | Kemp et al. | |
| 7,062,357 B2 * | 6/2006 | Merchant | G01M 7/022 700/275 |
| 7,104,122 B2 | 9/2006 | Kurai et al. | |
| 7,117,137 B1 | 10/2006 | Belcea | |
| 7,146,859 B2 | 12/2006 | Dittmann et al. | |
| 7,194,888 B1 | 3/2007 | Temkin et al. | |
| 7,257,522 B2 | 8/2007 | Hagiwara et al. | |
| 7,363,805 B2 | 4/2008 | Jayakumar et al. | |
| 7,383,738 B2 | 6/2008 | Schulz | |
| 7,441,465 B2 | 10/2008 | Oliver et al. | |
| 8,135,556 B2 | 3/2012 | Fricke | |
| 2001/0045941 A1 | 11/2001 | Rosenberg et al. | |
| 2002/0059610 A1 | 3/2002 | Chrystall et al. | |
| 2002/0134169 A1 | 9/2002 | Takeda et al. | |
| 2002/0170361 A1 | 11/2002 | Vilendrer et al. | |
| 2003/0029247 A1 | 2/2003 | Biedermann et al. | |
| 2003/0033058 A1 * | 2/2003 | Lund | F16F 15/02 701/1 |
| 2003/0183023 A1 | 10/2003 | Kusters et al. | |
| 2004/0019382 A1 | 1/2004 | Amirouche et al. | |
| 2004/0019384 A1 | 1/2004 | Kirking et al. | |
| 2004/0107082 A1 | 6/2004 | Sato et al. | |
| 2004/0255661 A1 * | 12/2004 | Nagai | G01M 17/022 73/146 |
| 2005/0027494 A1 | 2/2005 | Erdogmus | |
| 2005/0120783 A1 | 6/2005 | Namoun | |
| 2005/0120802 A1 | 6/2005 | Schulz | |
| 2006/0005616 A1 | 1/2006 | Bochkor et al. | |
| 2006/0028005 A1 | 2/2006 | Dell Eva et al. | |
| 2006/0059993 A1 | 3/2006 | Temkin et al. | |
| 2006/0069962 A1 | 3/2006 | Dittmann et al. | |
| 2007/0256484 A1 | 11/2007 | Imanishi et al. | |
| 2007/0260372 A1 | 11/2007 | Langer | |
| 2007/0260373 A1 | 11/2007 | Langer et al. | |
| 2007/0260438 A1 | 11/2007 | Langer et al. | |
| 2007/0275355 A1 | 11/2007 | Langer et al. | |
| 2008/0271542 A1 | 11/2008 | Schulz | |
| 2008/0275681 A1 | 11/2008 | Langer | |
| 2008/0275682 A1 * | 11/2008 | Langer | G01M 17/0072 703/8 |
| 2009/0012763 A1 | 1/2009 | Langer et al. | |
| 2010/0088058 A1 | 4/2010 | Fricke | |
| 2013/0030751 A1 | 1/2013 | Fricke | |
| 2013/0304441 A1 | 11/2013 | Fricke | |
| 2014/0107962 A1 | 4/2014 | Fricke | |

FOREIGN PATENT DOCUMENTS

| | | |
|---|---|---|
| DE | 4411508 A1 | 10/1995 |
| EP | 0890918 A2 | 1/1999 |
| EP | 0919201 A1 | 6/1999 |
| EP | 1396802 A2 | 3/2004 |
| EP | 1422508 A1 | 5/2004 |
| JP | H10281942 A | 10/1998 |
| JP | 2000289417 A | 10/2000 |
| JP | 2004053452 A | 2/2004 |
| JP | 2010526317 A | 7/2010 |
| JP | 2012504765 A | 2/2012 |
| WO | 9312475 A1 | 6/1993 |
| WO | 0023934 A1 | 4/2000 |
| WO | 2007133600 A2 | 11/2007 |
| WO | 2010039777 A1 | 4/2010 |

OTHER PUBLICATIONS

Translation of Chinese Office Action dated Jul. 3, 2017 for corresponding Chinese Patent Application 201480015056.2.
Chinese Office Action, dated May 10, 2018 for corresponding Chinese Patent Application No. 201480015056.2, filed Mar. 12, 2014.
D.W. Clarke: "Adaptative control of a materials-testing machine", 1996, The Institution of Electrical Engineers, pp. 4/1-4/4.
The 858 Mini Bionix II Test System Brochure; mts.com/downloads/300213.01.pdf; pub. 1999.
International Search Report and Written Opinion from the European Patent Office dated Aug. 1, 2014 for International application No. PCT/US2014/024273, filed Mar. 12, 2014.

\* cited by examiner

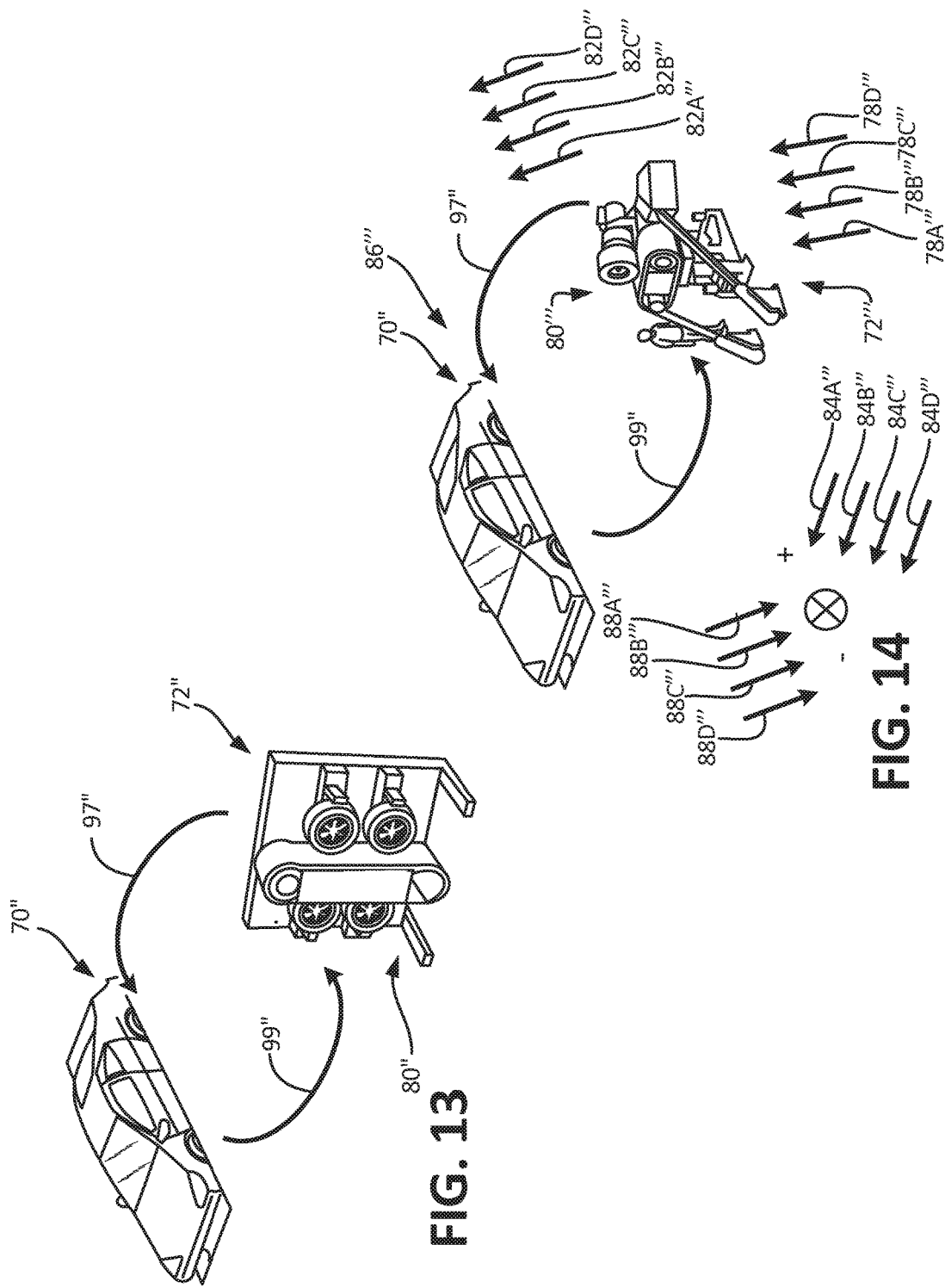

METHOD AND SYSTEMS FOR OFF-LINE CONTROL FOR SIMULATION OF COUPLED HYBRID DYNAMIC SYSTEMS

CROSS-REFERENCE TO RELATED APPLICATION

The present application is a divisional of and claims priority of U.S. patent application Ser. No. 13/857,300, filed Apr. 5, 2013, which is a continuation-in-part of application Ser. No. 13/416,150, filed Mar. 9, 2012, which is a continuation of application Ser. No. 12/244,597, filed Oct. 2, 2008, now U.S. Pat. No. 8,135,556, issued Mar. 13, 2012, the content of which are hereby incorporated by reference in their entirety.

FIELD

The present disclosure relates to the field of simulation, and more in particular, to methods and systems for controlling the simulation of dynamic systems.

BACKGROUND

The discussion below is merely provided for general background information and is not intended to be used as an aid in determining the scope of the claimed subject matter.

In the design and evaluation of complex dynamic systems, such as vehicles and vehicle components, it is desirable and often necessary to test and tune the components. This is to determine the effect of the vehicle component on vehicle performance, and the effect of the vehicle on the component. Durability testing may be performed as well as other types of tests that are desired. A number of different methodologies and systems have been employed in the testing of components in vehicles.

FIGS. 1-4 show a data collection system and method for a conventional laboratory simulation test. In such a method, a physical vehicle 10 is driven over a test road 12 and the specific component responses are measured. For example, the displacement of a suspension strut (not shown) installed in the physical vehicle 10 can be measured and stored in an appropriate database. These responses are provided as reference numeral 14. The responses of the specific component, such as the strut, are used as reference measurements for the test control process.

Referring now to FIG. 2, a generic (i.e., random amplitude, broadband frequency) drive 16, also referred to here as a random rig drive, is input into a test rig 18. The specific vehicle component, in this example a suspension strut 20, is installed in the test rig 18. A rig controller 22 converts the drive signal from the random rig drive 16 to control the movement of the test rig 18. A response of the test component, such as a displacement of the strut 20, is measured at the test rig 18. The measurements are provided at 24 to form the test component response. In the example of FIG. 2, the test component response 24 is a random rig displacement in response to the input and the rig 16. The inputting of the random rig drive 16 and the measurement of the random rig displacement 24 are real-time processes. The rig controller 22 need not be a complex tracking controller as it merely responds to the random drive 16. The rig controller 22 does not perform complex real-time modeling calculations to compensate for rig or specimen dynamics.

The test component response 24 is used with the test rig drive 16 to calculate a general system dynamic response model 26. The response model represents the coupled dynamics of the test system and component. In a multi-input-multi-output test it would also represent the cross-coupled dynamics between control inputs. The response model 26, typically a frequency response function (FRF), will be inverted, and used for test rig drive prediction in the simulation control process. In this example, the determination of the general system dynamic response model 26 is an off-line process, since the entire drive and response time histories are required to calculate a well-defined FRF.

Hence, in the conventional test system and process, the first step is to determine the input/output relationship that exists in the laboratory at the test rig 18. The relationship between the inputs to the control system for the test and how that system responds to those inputs needs to be understood. With this understanding, a compensated test drive signal can be developed to generate any desired component response.

Following the determination of how the components respond in a vehicle environment (see FIG. 1); and how the test environment influences the component response (see FIG. 2), an iterative test drive signal development process is then performed, as depicted in FIG. 3.

In an initial iteration (N=0), the test rig response 30 is considered to be zero, and the desired response 32, which was already determined in FIG. 1, is used with an inverse (FRF$^{-1}$) 40 of the general system dynamic response model 26 determined in FIG. 2. to create an initial drive 42. In each iteration, the current test rig response 30 is compared to the desired response 32. A comparator 34 provides the simulation error to generate a drive correction 38 using the inverse (FRF$^{-1}$). At this time, the iteration number is incremented.

The drive correction 38 is added to a previous test rig drive 40 to generate a next test rig drive 42. The determination of the next test rig drive 42 in response to the previous test rig response 30 is an off-line process.

The next test rig drive 42 is applied to the test rig 18 and the component response 30 is measured. The process of FIG. 3 is repeated iteratively until the resulting simulation error is reduced below a desired tolerance value. In performing test drive iteration, the test rig drive 42 is incrementally changed to obtain the response 30 from the test rig 18 that had been previously measured. In other words, a test rig drive 42 is determined that will produce the same response 30 from the physical vehicle component that was previously obtained during the data collection phase of FIG. 1.

Once the test rig drive 42 is determined through the iterative process until the simulation error is below a predetermined value, this now-final test rig drive 44 is used for subsequent testing of the component 20, as seen in FIG. 4. Different types of testing can be performed, such as a performance test, durability test, etc.

While the conventional iterative test method has certain benefits, it is a requirement for this method to secure a desirable vehicle, apply instrumentation and acquire test data before preparing the test. This makes the conventional simulation test system and method less useful in certain respects. It is possible that a suitable test vehicle to measure the component response cannot be obtained prior to the need to test the vehicle component. For example, it may be desired to determine the response of a vehicle component of a vehicle that does not yet exist, such as a new model car that is not yet in production or even prototyped. Further, there is often insufficient time or resources to properly prepare a vehicle to measure data for a physical component test. Further, a large number of component variations may need to be tested, and each variation would affect the component response in the vehicle. Also, a component's response within the vehicle system often changes gradually over time, such as in a durability test, and testing must be adapted for the test to remain valid.

FIG. 5, depicts another system and methodology for testing a physical component 62. As opposed to the test method depicted in FIGS. 1-4, a physical vehicle is not driven over the road with the installed key component. Instead, a virtual vehicle is used, without the key component installed, and is driven over a virtual road. This vehicle is modeled by a processor (not shown). The vehicle model, represented as reference numeral 50, excludes the physical test component. The vehicle model generates a response 52 from being driven over the virtual test road. This response 52 is applied through a reflected-memory processor link 54 as a control input 56 to a physical test system, such as a test rig 58.

The test rig 58 includes a complex rig controller 60 in which a model is provided. Whatever happens inside the virtual vehicle needs to happen to the physical component 62 within the test rig 58. Hence, the test rig 58 includes the physical test component that was not provided in the vehicle model 50.

The response of the physical component 62 in the test rig 58 is provided as an additional input 64 to the model of the vehicle 50. This response is provided to the model 50 in real time via the reflected-memory link 54.

The real-time process depicted in FIG. 5 is a closed-loop process that allows the physical component test response to be evaluated immediately, and automatically adapt to changes in the test environment. Limitations of the application of this system are the fidelity of the real-time vehicle model, the speed of the reflected-memory link and processors, and the tracking performance of the test rig controller 60. In order for such a system to work, the model 50 has to operate in real-time. To accomplish this with today's technology, the vehicle model 50 and the modeling in the rig controller 60 may have to be simplified. Also, real-time capable models may lack fidelity at higher frequencies, but an engineer evaluating durability may require simulation of these frequencies to achieve an accurate test. Hence, the real-time process and arrangement of FIG. 5 have constraints that can limit the usefulness of such a system.

SUMMARY

One general aspect includes an arrangement for controlling a coupled hybrid dynamic system including modeled components in a virtual model and physical components. The arrangement includes a physical test rig configured to drive the physical structural components and generate a test rig response including a coupling response corresponding to an input to the virtual model and a convergence response that is compared to an output of the virtual model. The arrangement also includes a storage device; and a processor operable with the storage device to store a virtual model of a complementary system to the physical structural components, the virtual model including a model of a disembodied assembly. The processor is configured to obtain a virtual dynamic response of the virtual model of the disembodied assembly; obtain a combined virtual dynamic response for a plurality of disembodied assemblies using the virtual dynamic response for the disembodied assembly; and obtain the system dynamic response model using the combined virtual dynamic response, the coupling response and the convergence response.

Implementations may include one or more of the following features. The arrangement where processor is configured to obtain the combined virtual dynamic response by using the virtual dynamic response for the disembodied assembly repeatedly for each disembodied assembly of the plurality of disembodied assemblies. The arrangement where the processor is configured to: obtain a first dynamic response using the drive of the physical structural components and the coupling response, obtain a second dynamic response using the drive of the physical structural components and the convergence response obtain a dynamic response matrix using the combined virtual dynamic response for the plurality of disembodied assemblies and the first dynamic response, and obtain the system dynamic response model using the dynamic response matrix and the second dynamic response Another general aspect includes a method of controlling a coupled hybrid dynamic system including modeled components in a virtual model and physical components, the virtual model being a complementary system to the physical structural components, the virtual model including a model of a disembodied assembly. The method includes: controlling a physical test rig to drive the physical structural components and generate a test rig response including a coupling response corresponding to an input to the virtual model and a convergence response that is compared to an output of the virtual model, and applying a virtual drive to the model of the disembodied assembly using the processor and obtain a virtual model response; obtaining a virtual dynamic response for the disembodied assembly using the virtual drive applied to the model of the disembodied assembly and the virtual model response; obtaining a combined virtual dynamic response for the plurality of disembodied assemblies using the virtual dynamic response for the disembodied assembly repeatedly in the virtual dynamic response for the plurality of disembodied assemblies; obtaining a first dynamic response using the drive of the physical structural components and the coupling response; obtaining a second dynamic response using the drive of the physical structural components and the convergence response; obtaining a dynamic response matrix using the combined virtual dynamic response for the plurality of disembodied assemblies and the first dynamic response; and obtaining the system dynamic response model using the dynamic response matrix and the second dynamic response.

BRIEF DESCRIPTION OF THE DRAWINGS

FIGS. 13 and 14 are schematic diagrams of other systems for test signal creation using the hybrid system response convergence method.

DETAILED DESCRIPTION OF THE ILLUSTRATIVE EMBODIMENT

The embodiments of the present disclosure address and solve problems related to the control of a hybrid dynamic system, such as the concerns regarding the need to acquire data in other systems, the need to do real-time modeling and the constraints such real-time modeling imposes. The embodiments of the present disclosure address and solve these concerns, in part, by providing an arrangement for controlling the simulation of a coupled hybrid dynamic system. The arrangement comprises a physical test rig configured to drive a physical structural component of the hybrid dynamic system and to generate a test rig response as a result of applying a drive signal input to the test rig. The processor is configured with a virtual model of the components that are complementary to the physical component of the hybrid dynamic system. The processor receives a first part of the test rig response and generates a response of the virtual model of the complementary system based on using the first part of the received test rig response and a virtual drive as inputs. The processor is further configured to compare a different, second part of the test rig response with the corresponding response from the virtual model of the complementary system ("model response"), the difference being used by the processor to form a system dynamic response model using the test rig drive signal. The foregoing comprises a system response modeling step.

In a test drive development step, as provided in certain embodiments, the inverse of the system dynamic response model is used to iteratively reduce the difference between the response from the virtual model of the complementary system and the test rig response below a defined threshold. The method avoids the need to model the physical component, where, in fact, accurate models of the component are not available. Hence, limitations based on computing power, computing speed, and the availability of an accurate model of the tested component are avoided.

Figure 6:
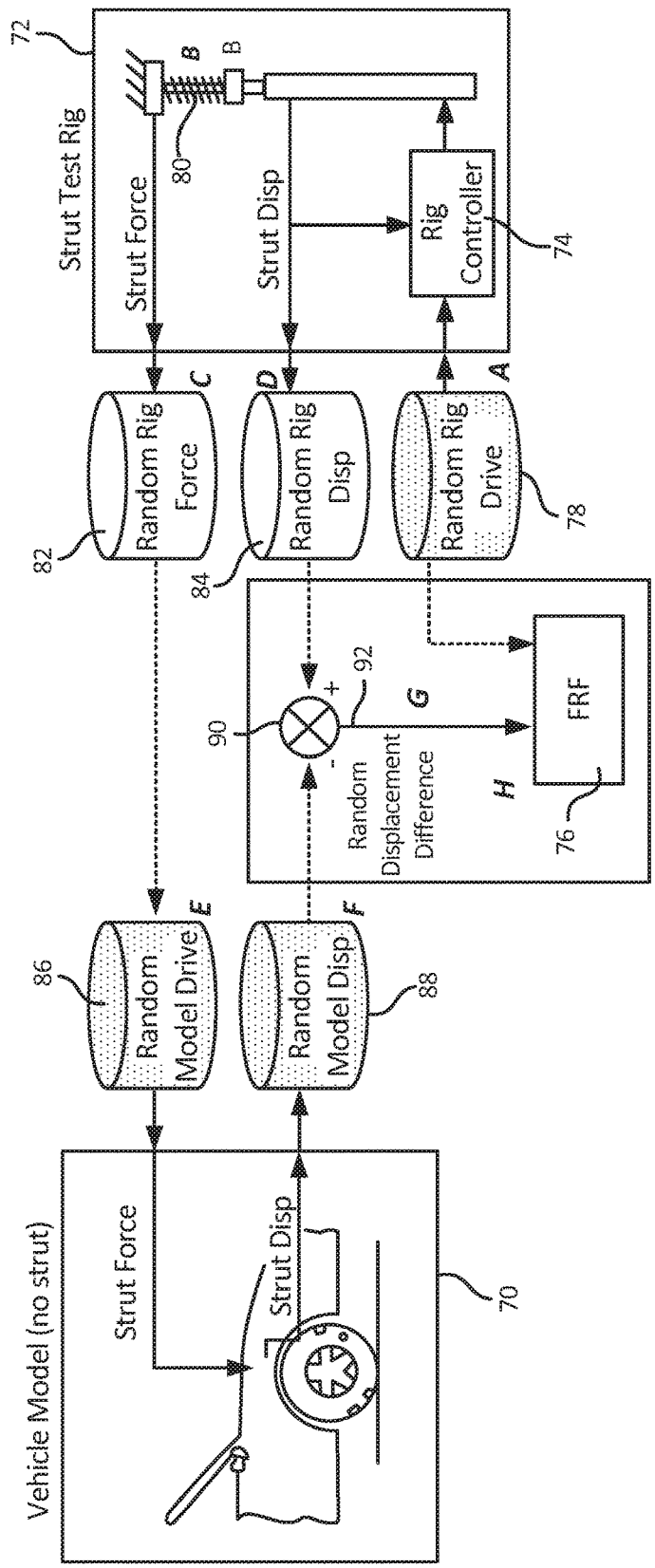
FIG. 6 is a schematic block diagram of a system for performing a hybrid system dynamic response measurement using the hybrid system response convergence (HSRC) method.

FIG. 6 depicts an arrangement for controlling the simulation for a coupled hybrid dynamic system in accordance with the disclosed embodiments. In the arrangement, a complementary vehicle model 70 is provided on a processor (seen in FIG. 9). The model of a vehicle is exemplary only, however, as other systems may be modeled without departing from the present disclosure. For instance, in a manufacturing process, the system includes the manufacturing machines (e.g. presses, molding apparatus, forming machines, etc.) and the drive signal provides command signals to said machines, and the responses comprise manual or automatic measured parameters of the manufactured article such as a critical dimension. Another example includes an oil refinery where the system is the process plant and the response comprises intermediate or final parameters related to output products.

Also, for purposes of explanation, the physical component is a strut employed in a vehicle suspension system. Other components may be tested, as the strut is an example only of a physical component. A test rig 72 is also provided that accepts drive(s) and provides response(s). In this example, the test rig 72 is configured to test a physical strut mounted within the test rig 72. However, the test rig 72 may be configured to test other structural components.

Figure 4:
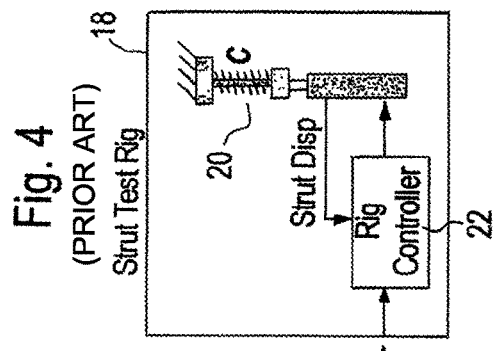
FIG. 4 is a schematic block diagram of the system for performing a simulation laboratory test in accordance with the prior art.
Figure 5:
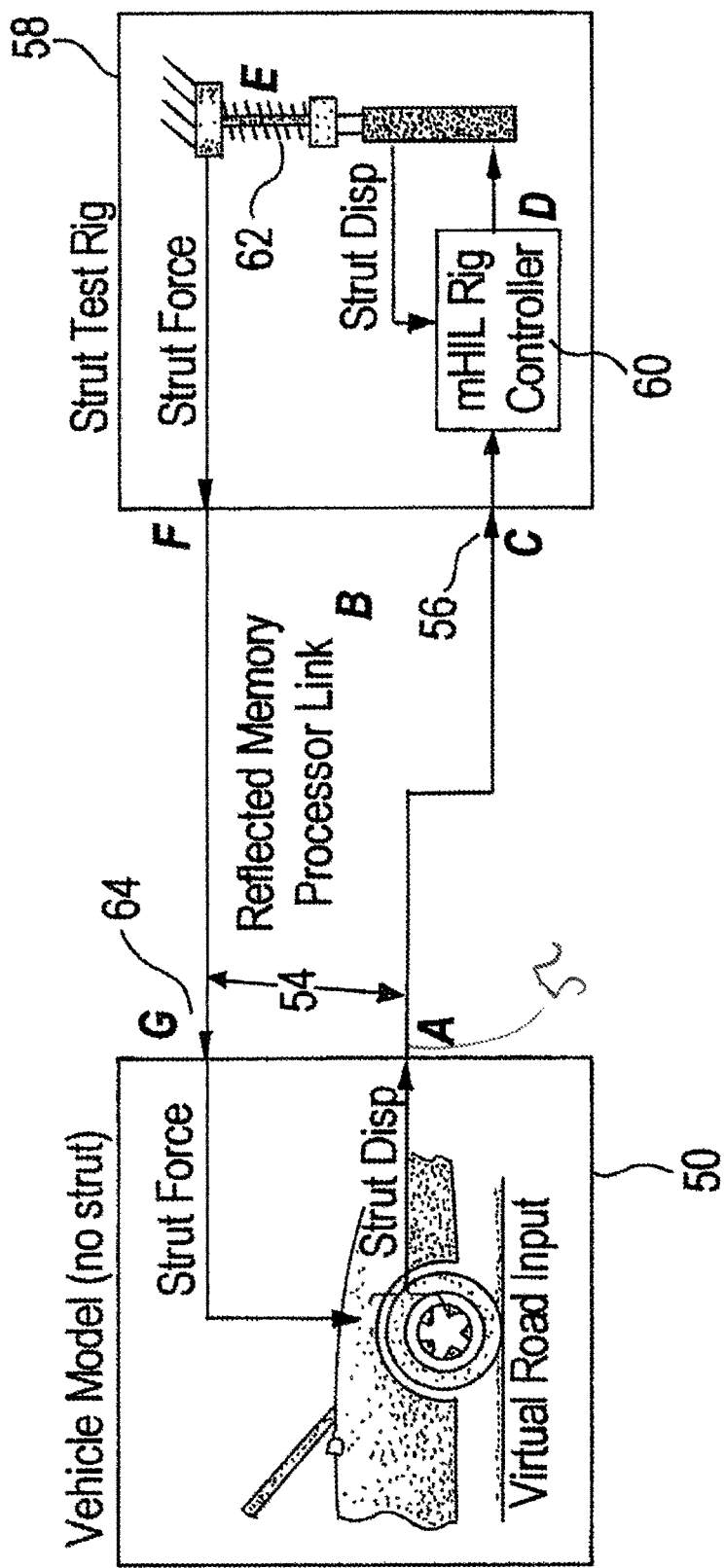
FIG. 5 is a schematic block diagram of a real-time system in accordance with the prior art.

The test rig 72 has a rig controller 74. Unlike the rig controller 60 of the real-time system of FIG. 4, the rig controller 74 in the embodiment of FIG. 5 does not need to have a complex system model that provides an instantaneous response to a model command. Because of its lack of complexity, a less expensive rig controller may be employed. Furthermore, testing in higher frequencies may be realized.

The arrangement forms or ascertains a system dynamic response model that can be employed to generate a drive signal used to drive the test rig 72. The system dynamic response model 76 may be a frequency response function (FRF), as one example. The system dynamic response model 76 may also be determined, or calculated, by the same processor on which the model 70 of the complementary is run. (See FIG. 9, for example). However, a system dynamic response model 76 may also be determined and calculated on a separate processor, not shown in the Figures.

FIG. 6 depicts the arrangement and steps to form the system dynamic response model 76. This can be termed the system response modeling step. This system dynamic response model 76 can be employed in the iterative process of FIG. 7, described later. In FIG. 6, a random test rig drive 78 is played into the test rig 72 that has a vehicle component 80 (such as a strut) installed. The random test rig drive 78 may be a generic drive, such as a random amplitude, broadband frequency drive. Two responses are measured in the disclosed embodiment although the arrangement is not limited to two responses. One of these responses, such as a random test rig force signal 82, is to be applied to the vehicle model 70 of the complementary system. The other response, such as a random rig displacement 84, is a response to be compared to the response of the virtual model 70 of the complementary system. In the disclosed embodiment of FIG. 6, the first response 82 is the force exerted by the strut on the test rig 72, while the second response 84 is the displacement of the strut 80, which can also be provided as an input to the rig controller 74. It is to be noted that the force and displacement signals are exemplary only, as other response signals may be provided from the test rig 72.

The response from the test rig 72, such as the random rig force 82, is supplied as an input to form a random model drive 86 to the virtual vehicle model 70 of the complementary system. The y virtual vehicle model 70 of the complementary system excludes the component under test, in this case the strut 80. The virtual vehicle model 70 of the complementary system responds to the random model drive input signal 86 with a random model response signal 88, in this case a displacement.

In the third step of the process, the random response 88 of the virtual model 70 of the complementary system is compared to the associated test rig random response 84. A comparison 90 is performed to form a random response difference 92 (herein by example a displacement). The relationship between the random response difference 92 and the random rig drive 78 establishes the system dynamic response model 76. The system dynamic response model 76 will be inverted and used for test rig drive prediction in the iterative simulation control process of FIG. 7.

Figure 7:
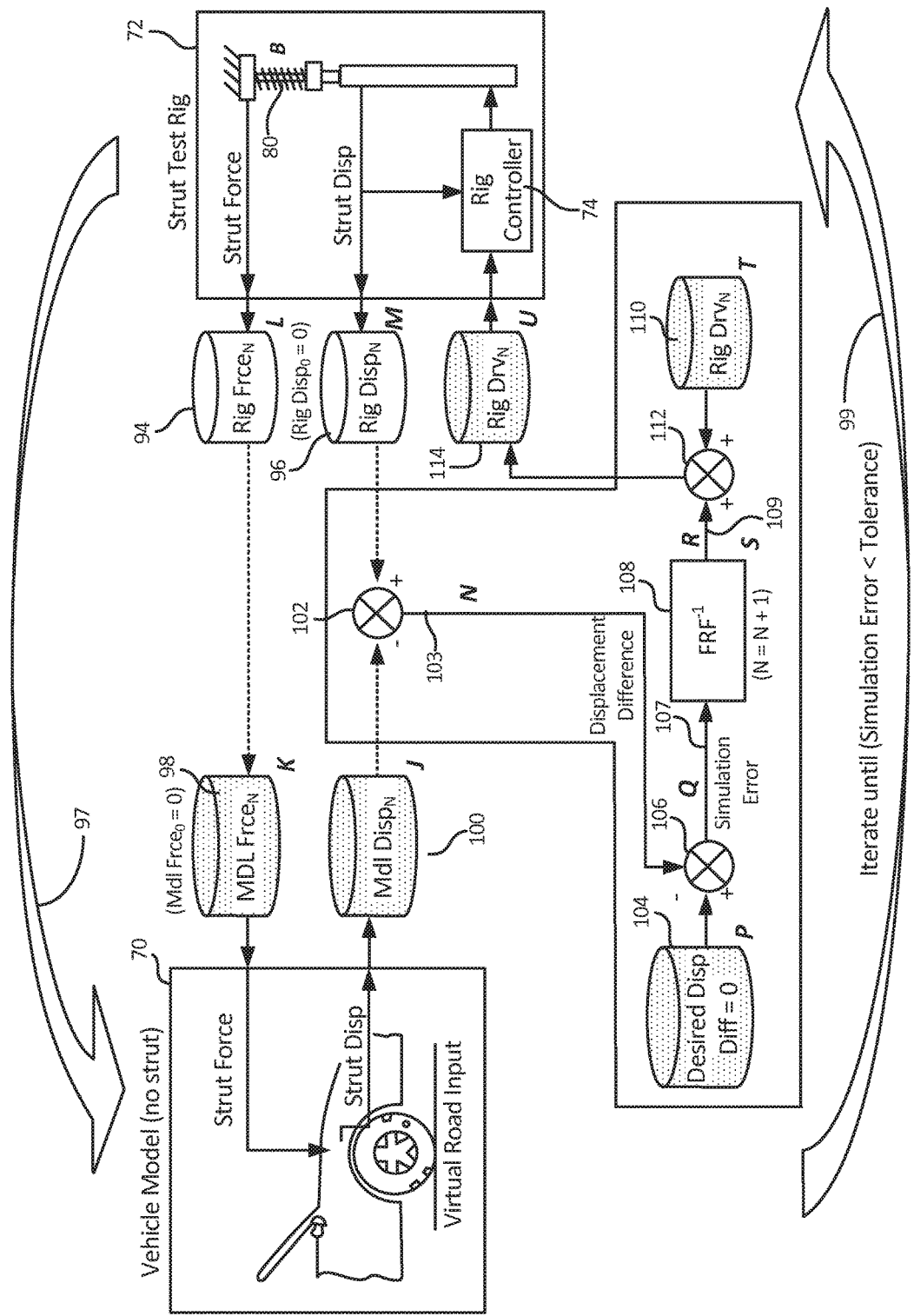
FIG. 7 is a schematic block diagram of an iteration process employing the system of FIG. 6 for the purpose of creating hybrid system response convergence (HSRC) test control signals.

The determination of the system dynamic response model 76 may be done in an offline process, such that high powered and high speed computing capabilities are not required. Further, since there is no need to acquire data, any component can be tested without previous knowledge of how that component is going to respond within a virtual model, or in a physical environment. The offline measurement of the system dynamic response model 76 measures the sensitivity of the difference in response 88 of the virtual model of the complementary system and rig response 84 to the rig inputs when the component 80 is in the physical system. Once the relationship between rig drive 78 and system response difference 92 has been modeled, an offline iteration process is performed, as seen in FIG. 7. This may be considered as the test drive development step.

In the iterative process of FIG. 7, which is an offline iteration, the virtual model 70 of the complementary system, which excludes the test component 80, is operated. In the exemplary embodiment, the virtual model 70 is the complementary system of a virtual vehicle and the test component that is excluded is the strut 80. The virtual vehicle is driven over a test road, to generate a response 100 of the virtual model 70 of the complementary system. As an example, the response 100 may represent a displacement of the strut 80, although since the strut 80 is not actually present, it is really the displacement of the space that would be occupied by the strut 80 that is measured by the response 100. An additional input to the virtual model 70 of the complementary system, in addition to the virtual test road input, is shown as reference numeral 98. The additional model input 98 to the vehicle model 70 of the complementary system is based on the test rig response 94 from the test rig 72. The additional model input 98, such as the force measured at the test rig 72 is applied simultaneously to the vehicle model 70 during testing. For an initial iteration (N=0), the input 98 to the virtual model 70 of the complementary system will typically be at zero.

The response 100 of the virtual model 70 of the complementary system is compared to the test rig response 96 from the test rig 72. This test rig response 96 must also be a displacement, if the response 100 of the virtual model 70 of the complementary system is a displacement. A comparison of 102 is made between the test rig response 96 and the response 100 of the virtual model 70 of the complementary system to form a response difference 103.

The response difference 103, in this case a displacement difference, is compared to a desired difference 104. Typically, the desired difference 104 will be set at zero for an iterative control process. In further embodiments, however, other desired differences may be employed without departing from the scope of the present disclosure.

The comparison 106 between the response difference 103 and the desired difference 104 produces a simulation error 107 used by the inverse ($FRF^{-1}$) of the system dynamic response model 76 that was previously determined in the steps shown in FIG. 6. The inverse of the system dynamic response model 76 is depicted as reference numeral 108 in FIG. 7. A drive correction 109 is added to the previous test rig drive signal 110 at 112 to generate the next test rig drive signal 114.

The next test rig drive signal 114 is applied to the test rig 72 and first and second responses are measured. The response 94 to be applied to the vehicle model 70 generates via the processor and the virtual model 70 of the complementary system response 100 that is compared to test rig response 96. The process is repeated iteratively (represented by arrows 97 and 99) until the resulting simulation error 107 is reduced to a desired tolerance value.

The processing of the vehicle model 70 and the determination of the final test rig drive signal 114 is capable of being performed within a single processor. However, in certain embodiments, multiple processors may be employed. Also, it should be understood that the process for determining the simulation error 107 and the determination of the test rig drive signal 114 may be performed offline, providing the advantages discussed earlier.

Figure 8:
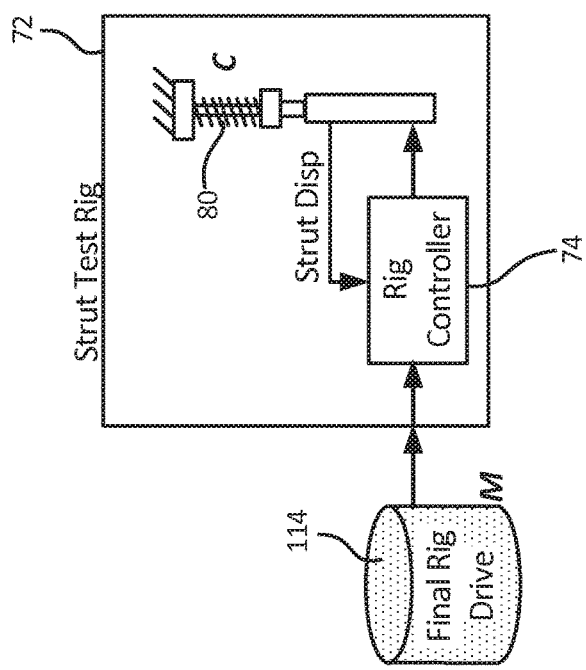
FIG. 8 is a schematic block diagram of an exemplary test.

Following the determination of the test rig drive signal 114, the final test rig drive signal 114 is used in testing of the test component 80, as seen in FIG. 8. The test rig drive signal 114 is an input to the test rig controller 74 that drives the rig 72. Hence, performance testing, durability testing and other types of testing may be performed on the physical component 80, such as a strut, without the need for a physical vehicle to have been previously measured and tested, or in fact, to even exist. Neither is a complicated model of the component needed, as the physical component is part of the hybrid dynamic system. The offline measurements allow the model 70 of the hybrid dynamic system to be used, avoiding the need for a physical vehicle or other system, but without requiring the performance of a real-time modeling system.

Figure 2:
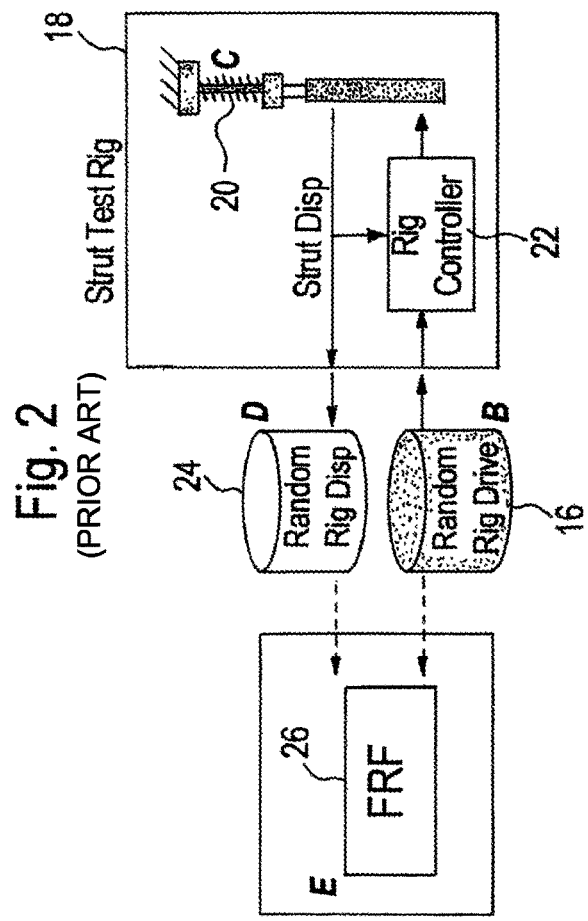
FIG. 2 is a schematic and block diagram of measurement of a response model for a response-simulation test arrangement in accordance with the prior art.
Figure 1:
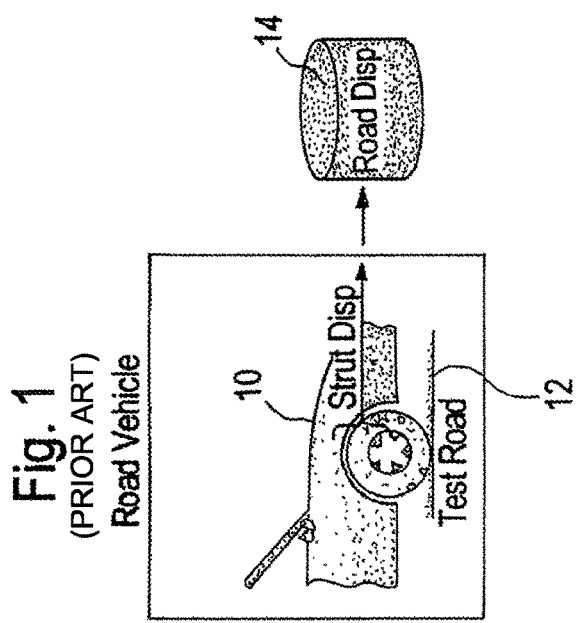
FIG. 1 is a schematic and block diagram of a data collection process in accordance with the prior art.
Figure 3:
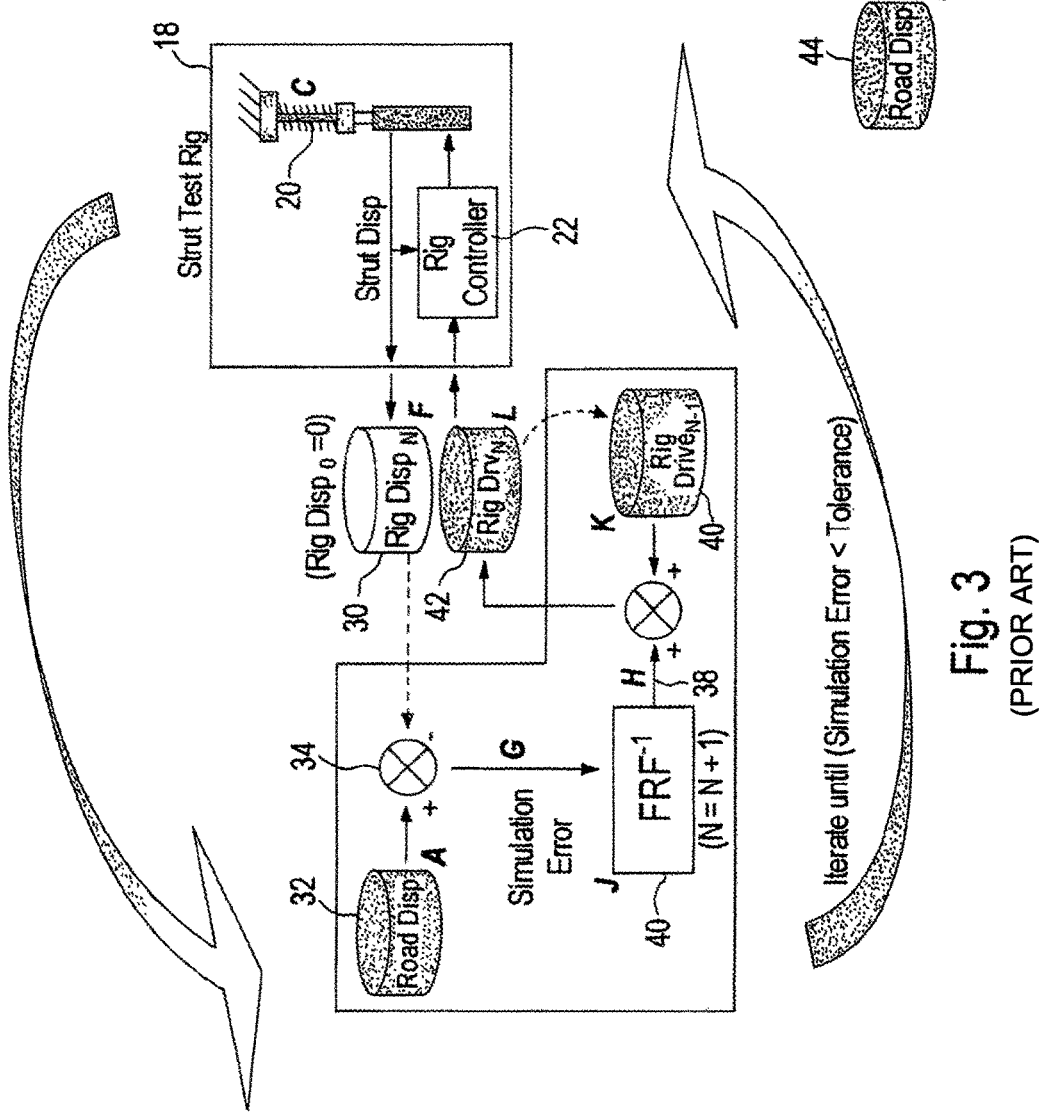
FIG. 3 is a schematic and block diagram of the response-simulation test system performing an iterative simulation error reduction process in accordance with the prior art.
Figure 9:
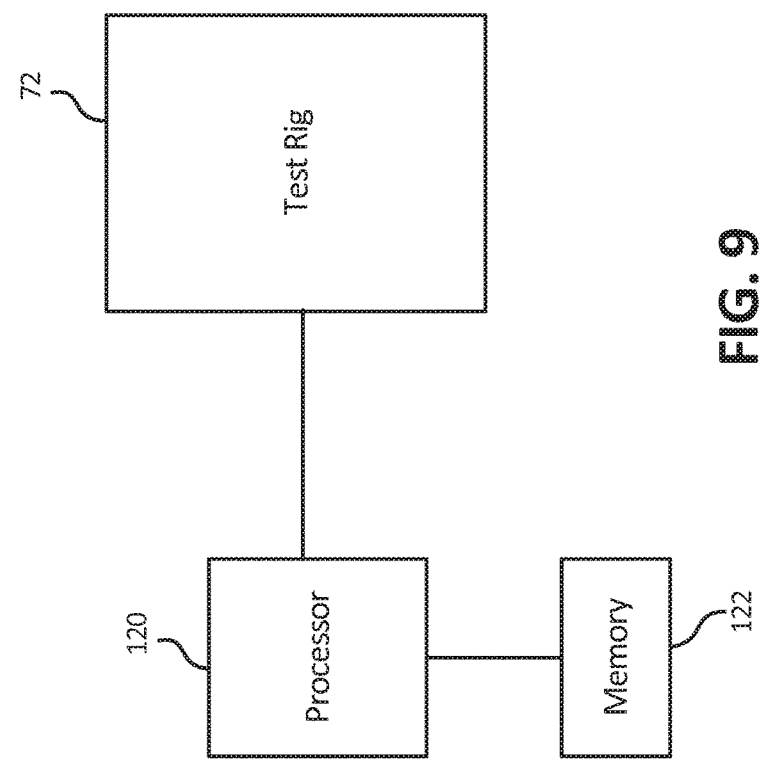
FIG. 9 is a schematic block diagram of a system for performing the processes illustrated in FIGS. 6-8.

FIG. 9 shows a block diagram of a processor 120 coupled to a test rig 72. The processor 120 may also be coupled to a database 122 and any other conventional components associated with processing, such as an interface, monitor, etc. Note that although shown as a connection between the processor 120 and the test rig 72, the connection is not a reflected memory processor link 54 shown in FIG. 3 of the real-time system. The coupling between the processor 120 and the test rig 72 is merely to provide signals to the test rig 72 as already depicted in FIGS. 6-8.

Figure 10:
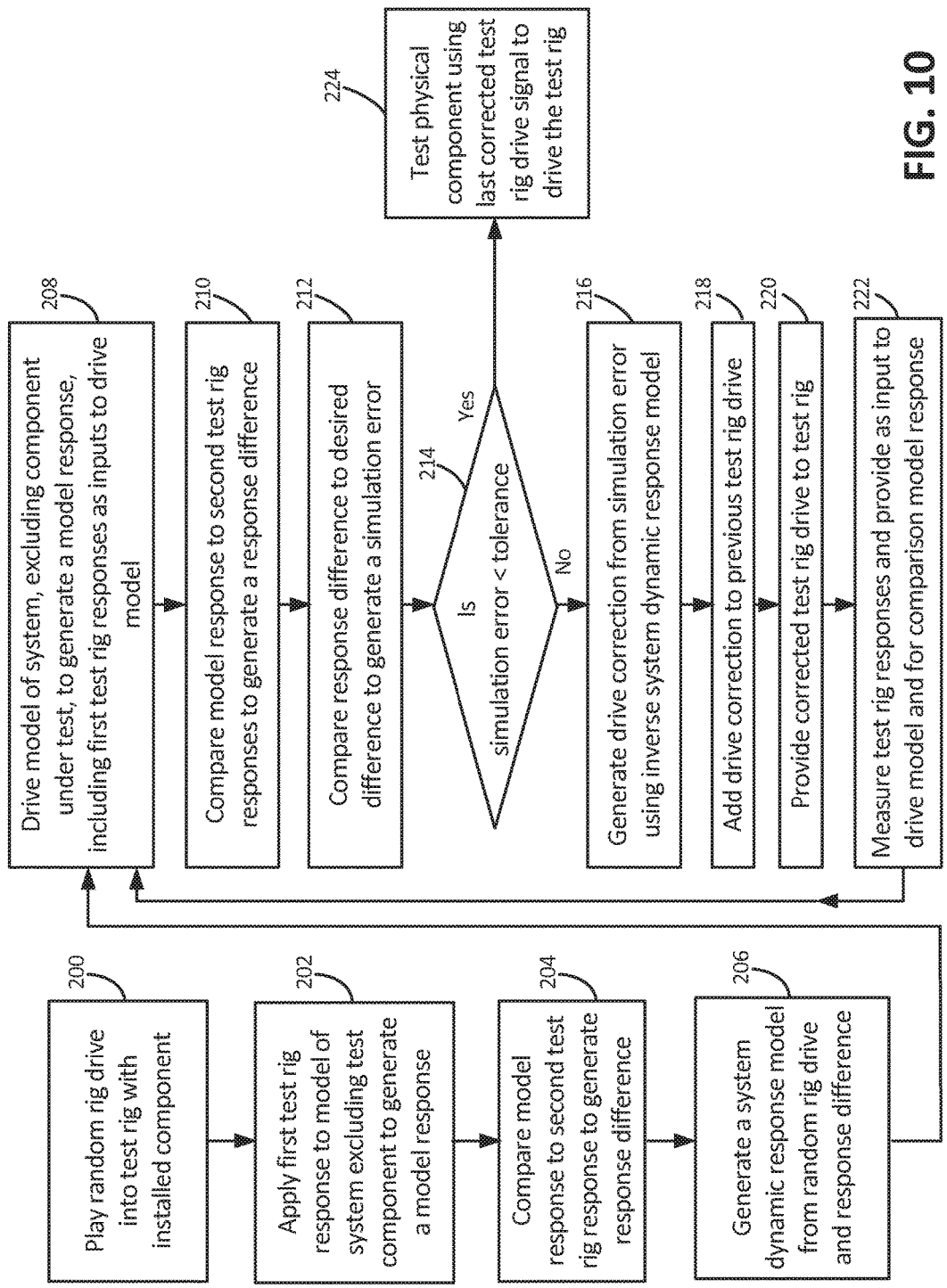
FIG. 10 is a flow chart of certain steps within a method for performing hybrid system dynamic response measurement and test control signal creation using the hybrid system response convergence method.

FIG. 10 shows a simplified method for performing offline control of the simulation of coupled hybrid dynamic systems in accordance with the disclosed embodiments. The methodology depicted in FIG. 10 encompasses the steps described with respect to FIGS. 6-8.

In step 200, a random rig drive 78 is played into the test rig 72 with the installed component 80. In step 202, the first test rig response 82 is applied to the virtual model 70 of the complementary system (excluding the test component) to generate a response 88. The response 88 is compared to the second test rig response 84 to generate a response difference 92 in step 204. In step 206, a system dynamic response model 76 is generated from the random rig drive 78 and the response difference 92. Steps 200-206 represent the steps that are described with respect to FIG. 6, such that these steps perform an off-line measurement of the system dynamic response model 76, such as a frequency response function.

Steps 208-222, described below, represent the steps performed in the off-line iteration process of FIG. 7. In step 208, the virtual model 70 of the complementary system is driven, which excludes the component under test, to generate a response 100 of the virtual model 70 of the complementary system. The driving of the virtual model includes test rig response(s) as inputs (e.g. input response 98) to the virtual system model 70. In step 210, the response 100 of the virtual model 70 of the complementary system is compared to an alternate test rig response 96 to generate a response difference 103. The response difference 103 is compared to a desired difference 104 in step 212 to generate a simulation error 107. In step 214, it is decided whether the simulation error 107 is less than a tolerance value. Assuming the answer is no, then a drive correction 109 is generated from the simulation error 107 using an inverse system dynamic response model 108, in step 216. The drive correction 109 is added to the previous test rig drive 110, in step 218. The corrected test rig drive 114 is provided to the test rig 72 in step 220, and the test rig responses 94. 96 to the test rig drive 114 are measured and provided as an input to the virtual model 70 and for comparison to the response 100, respectively in step 222. The process returns back to step 208 and repeats until the simulation error 107 is less than the tolerance 104, as determined in step 214.

Step 224 represents the process of testing the physical component 80 depicted in FIG. 8. The physical component 80 is tested using the last corrected test rig drive signal 114 to drive the test rig 72.

The embodiments of the present disclosure are not limited to any specific combination of hardware circuitry and software. According to certain aspects of the present disclosure, processing may be implemented using the processor 120 of FIG. 9 executing one or more sequences of one or more instructions contained in database or memory 122. Such instructions may be read into database or memory 122 from another machine-readable medium, such as a disk containing instructions and read by a disk drive (not shown), for example. Execution of the sequences of instructions contained in the database or memory 122 causes processor 120 to perform the process steps described above. One or more processors in a multi-processing arrangement may also be employed to execute the sequences of instructions contained in database or memory 122. In alternative embodiments, hard-wired circuitry may be used in place of or in combination with software instructions to implement various embodiments of the present disclosure.

The term "machine-readable medium" as used herein refers to any medium that participates in providing instructions to processor 120 for execution. Such a medium may take many forms, including, but not limited to, non-volatile storage media, volatile storage media, and transmission media. Non-volatile storage media include, for example, optical or magnetic disks. Volatile media include dynamic memory. Transmission media include coaxial cables, copper wire, and fiber optics. Transmission media can also take the form of acoustic or light waves, such as those generated during radio frequency and infrared data communications. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, a carrier wave, or any other medium from which a computer can read.

Figure 11:
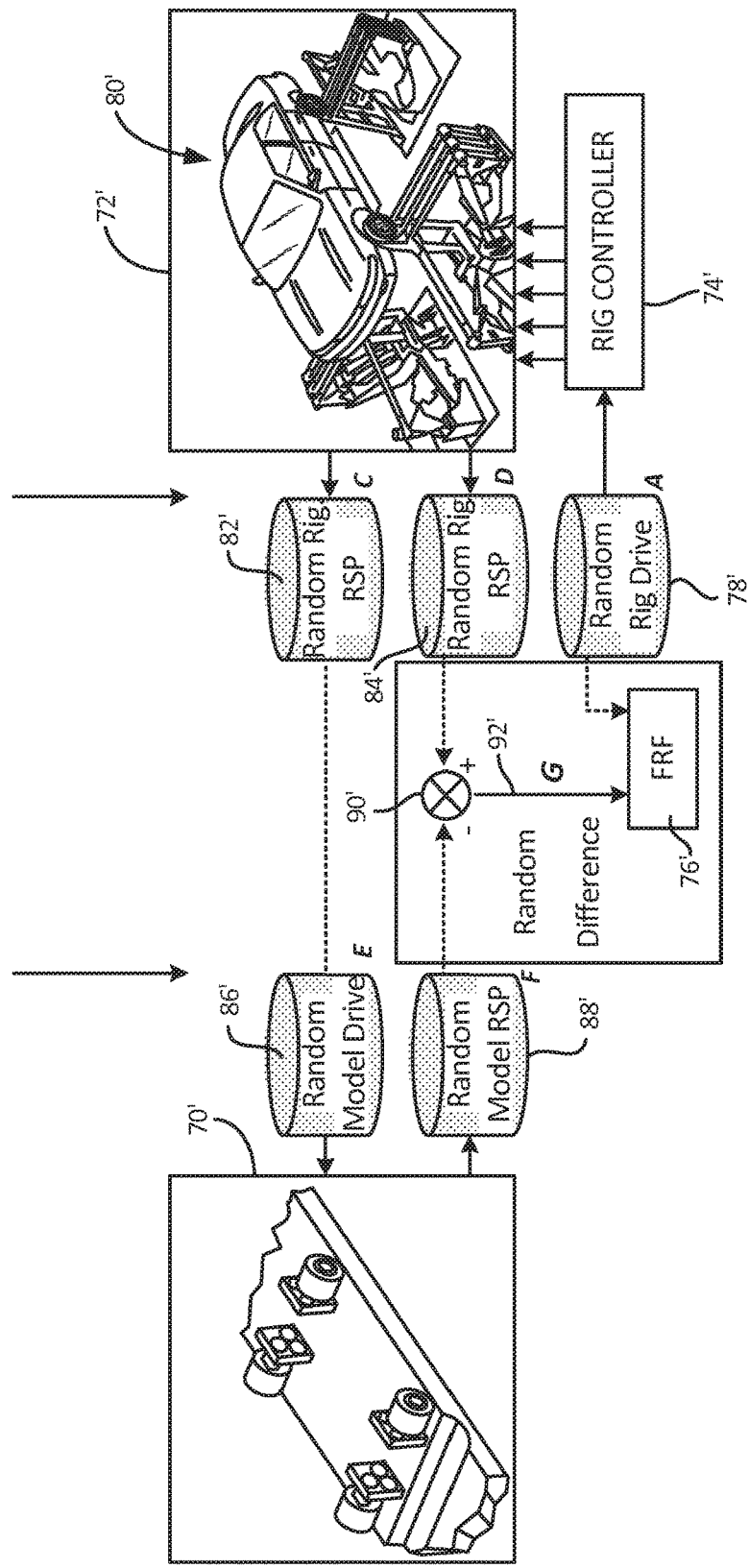
FIG. 11 is a schematic diagram of another system for performing hybrid system dynamic response measurement using the hybrid system response convergence method

As indicated above, a test rig can be used for other structural components other than the strut 80 in the above embodiments. In addition, as also indicated above, the number of responses used between the physical system (e.g. the strut 80 in the embodiment above) and the virtual model 70 of the complementary system can be greater than two if desired. FIG. 11 depicts the arrangement and steps to form the hybrid system dynamic response model for full vehicle simulation wherein the physical system comprises a complete vehicle less each of the wheels and tires, which are each embodied in a virtual model 70'. FIG. 11 uses the same reference numbers (however denoted with a prime "'") as used in FIG. 6 since generally the same components and processing are used.

Figure 12:
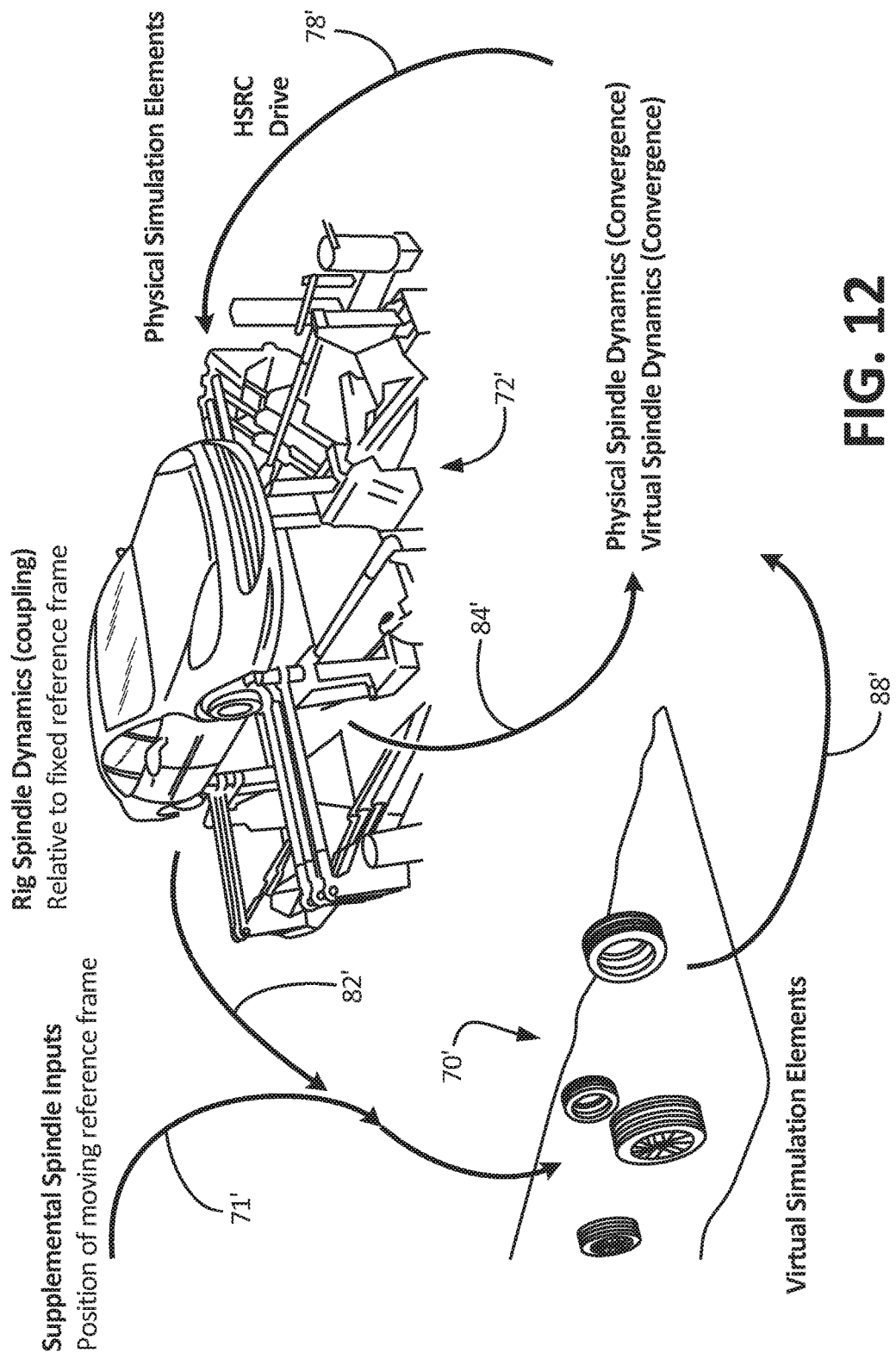
FIG. 12 is a schematic diagram of an iteration process employing the system of FIG. 11.

In particular, in FIG. 11, a random test rig drive 78' is played into the test rig 72' that has a vehicle 80' installed thereon. In this embodiment, the test rig 72' applies loads and/or displacements to each spindle of the vehicle 80'. The random test rig drive 78' may be a generic drive, such as a random amplitude, broadband frequency drive. Multiple responses 82', for instance six degrees of freedom (6 DOF) are obtained from suitable sensors for each spindle and are applied to the virtual model 70' of the complementary system, in this embodiment, comprising a virtual tire and wheel assembly for each spindle. For instance, and without limitation, the multiple responses 82' can comprise at each spindle, as illustrated in FIG. 12, a vertical force, a longitudinal displacement, a lateral displacement, a camber angle and a steer angle. Other responses 84' from the test rig 72' are compared with the responses 88' from the virtual model 70' of the complementary system. Again, for instance, and without limitation, the responses 88' can comprise a vertical displacement, a longitudinal force, a lateral force, a camber moment and a steer moment. It is to be noted that the force and displacement signals are exemplary only, as other response signals may be provided from the test rig 72'.

Referring back to FIG. 11, the responses 82' from the test rig 72' are supplied as inputs to form a random drive 86' to the virtual model 70' of the tire and wheel assemblies. The virtual vehicle model 70' excludes the components under test, in this case the vehicle 80' less the wheels and tires. The virtual model 70' responds to the random drive input signals 86' with random response signals 88'.

In the third step of the process, the random responses 88' of the virtual model 70' of the tires and wheels are compared to the associated test rig random responses 84'. A comparison 90' is performed to form random response differences 92' (herein comprising forces, moments and a displacement). The relationship between the random response differences 92' and the random rig drives 78' establishes the system dynamic response model 76'. The determination of the combined system dynamic response model 76' may be done in an offline process, such that high powered and high speed computing capabilities are not required. The offline measurement of the system dynamic response model 76' measures the sensitivity of the difference in the responses 88' of the virtual model 70' of the tires and wheels and rig responses 84' to the rig inputs 76' when the vehicle 80' is in the physical system. Once the relationship between rig drive 78' and system response differences 92' have been modeled, an offline iteration process is performed in a manner similar to FIG. 7 *but* not otherwise illustrated and described in detail since it should be readily apparent having shown the relationship between FIGS. 6 and 11. As described with respect to FIG. 7, iteration is performed in the hybrid dynamic system of FIGS. 11 and 12 until the simulation error in this hybrid dynamic system is less than a selected tolerance value. It should be noted that in a manner similar to the additional virtual road input to the vehicle model 70 of FIG. 7 a similar road input can be provided to the model 70' of the tires and wheels along with yet further exemplary supplemental inputs indicated at 71' in FIG. 12, if desired.

FIGS. 13 and 14 illustrate yet other examples of hybrid dynamic system testing comprising a complete vehicle. The embodiment of FIG. 13 is simply the opposite to that of the embodiment of FIGS. 11 and 12. In particular, the embodiment of FIG. 13 includes a test rig 72" and four physical tire and wheel assemblies collectively indicated at 80'''. The virtual model 70'' of the complementary system to the tire and wheel assemblies 80' comprises a model of a vehicle (less each of the tire and wheel assemblies). Operation of this hybrid dynamic system to ascertain its associated system dynamic response model again follows the procedure as described with respect to the previous embodiments of FIGS. 6 and 11, the specific description of which would only be redundant. Likewise, having ascertained the system dynamic response model in a manner similar to FIGS. 6 and 11, the system dynamic response model is inverted and used for test rig drive prediction in an iterative simulation control process similar to that of FIG. 7 and represented in FIG. 13 by arrows 97'' and 99'' until the simulation error in this hybrid dynamic system is less than a selected tolerance value.

FIG. 14 illustrates a hybrid dynamic system wherein a single physical component/substructure and associated test rig can be used multiple times in order to obtain the multiplicity of rig responses to simulate a plurality of actual physical components that would be present in the hybrid dynamic system. FIG. 14 is similar to FIG. 13 in that it includes the virtual model of the vehicle 70'' less each of the tire and wheel assemblies. However, in the embodiment of FIG. 14 the test rig 72''' is configured to apply forces and displacements to a single physical tire and wheel assembly 80'''. Nevertheless, the embodiment of FIG. 14 can basically obtain similar results to that of the embodiment of FIG. 13. As in the previous embodiments, system dynamic response model is ascertained in a manner substantially similar to that described above with respect to FIG. 11, which drives the test rig 72' with random drives 78''' that actually comprise four sets of random drives 78A''', 78B''', 78C''' and 78D''', where each set represents a random drive for the test rig 72''' for each of the four tire and wheel assemblies on the vehicle. With each application of one of the random drives 78A''', 78B''', 78C''' and 78D''', a corresponding first test rig response 82A''', 82B''', 82C''' and 82D''' and a corresponding second test rig response 84A''', 84B''', 84C''' and 84D''' are obtained. Collectively, the first test rig responses 82A''', 82B''', 82C''' and 82D''' are used as a random model drive 86''' to the virtual vehicle model 70'', which generates corresponding responses 88A''', 88B''', 88C''' and 88D''' that are compared with the second test rig responses 84A''', 84B''', 84C''' and 84D''' (offline). Since each of the random drives 78A'''-78D''' can be applied successively to the test rig 72''' (and which are also stored) where corresponding test rig responses 82A'''-82D''' and 84A'''-84D''' can be generated and stored, it should be clear that the random model drive 86''' can be obtained and processed with the model 70'' to generate the responses 88A'''-88D''', which are subsequently compared to test rig responses 84A'''-84D'''. Hence, although a single physical tire and wheel assembly was used in test rig 80''', the system dynamic response model obtained from the hybrid dynamic system of FIG. 14 would be very similar to the system dynamic response model obtained from the hybrid dynamic system of FIG. 13. The embodiment of FIG. 14 can thus basically duplicate the results obtained from that of the embodiment of FIG. 13. This is possible because actuation of the test rig 72''' to obtain rig responses and the processing of the virtual model 70'' of the complementary system with the rig responses are decoupled from each other.

The foregoing describes the iterative test development step would work (with sequential application of inputs to a single rig representing herein each individual tire). For the preceding dynamic modeling step it could also be done in this manner. But it might be preferable to use the approach described in FIG. 15 below for the modeling step, since it is not necessary to measure the dynamic behavior of the same system four times. One FRF of the specimen (rig+tire) could be combined mathematically with the FRF of the virtual vehicle (opposite mode to that illustrated in FIG. 15.)

Like the process used to ascertain the system dynamic response model, the iterative process to obtain suitable final drives for the test rig 72''' also entails applying drives to the test rig 72''' separately and storing the associated rig responses until all four sets of each type of rig responses are obtained and before one group of the four sets of test rig responses are applied to the virtual model 70''' of the complementary system and used in a similar manner to that of FIG. 7 with an inverse of the system dynamic response model in the iterative process until the simulation error is below the selected tolerance. As appreciated by those skilled in the art, overall testing time will typically take longer sequentially using the single physical component 80''' and test rig 72''' (in this embodiment four separate times); however, savings can be obtained since the test rig 72''' may be less expensive than that of test rig 72'' and less individual physical components are needed in the test rig 72'''.

Figure 15:
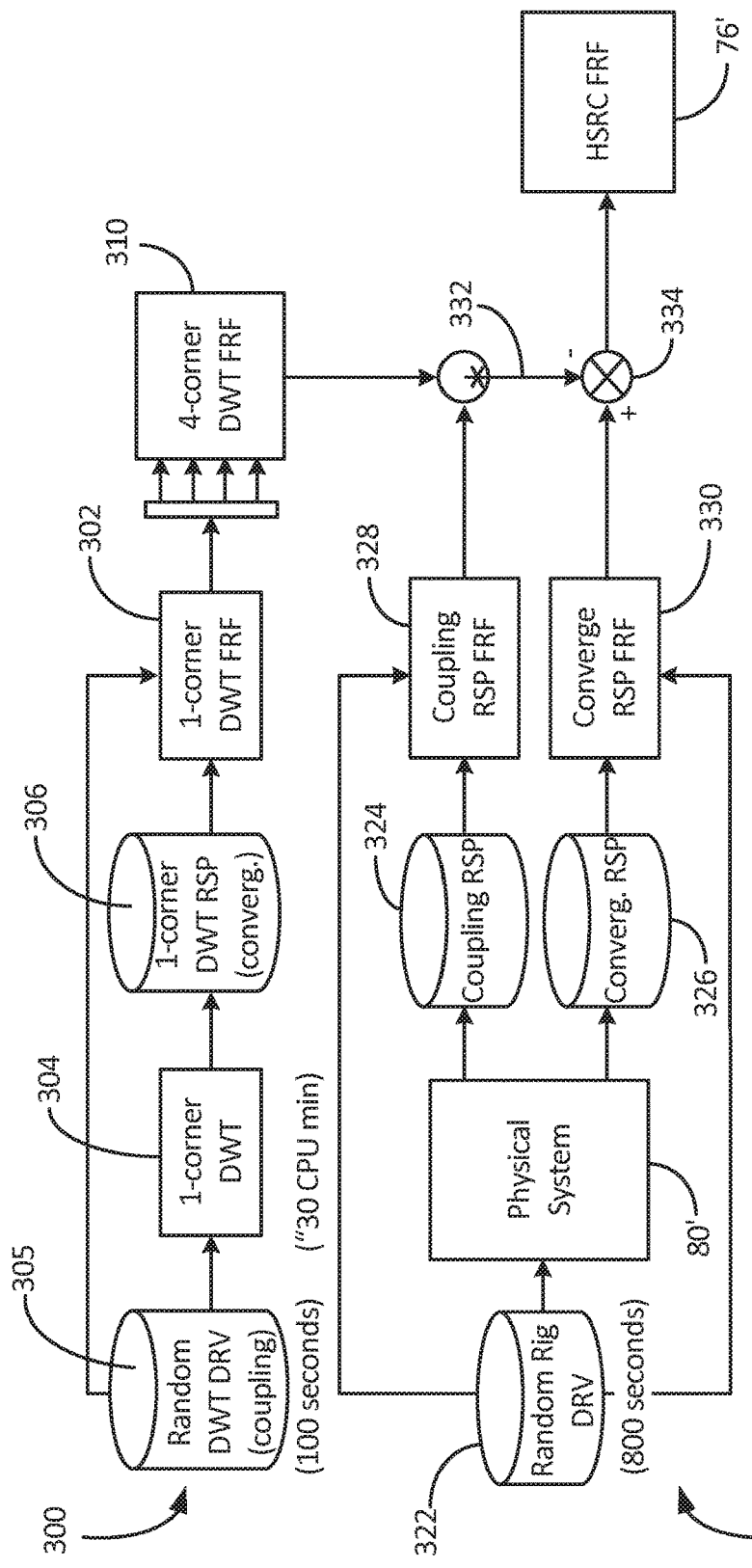
FIG. 15 is a schematic diagram of an alternative method for performing hybrid system dynamic response measurement for the system described in FIG. 11.

FIG. 15 illustrates an embodiment where the system identification excitation signal can be tailored to the complexity and computational burden associated subsystems (physical or virtual) being identified. In effect, this can improve the speed in which calculation of the system dynamic response model for a complete hybrid dynamic system such as illustrated in FIGS. 11-14 is obtained. In FIGS. 11-12 a plurality of virtual subsystems are present in the model 70' for each of the tire and wheel assemblies. Likewise, in FIG. 13 a plurality of physical subsystems 80'' are present in the test rig 72'', while the plurality of physical subsystems are represented by a single physical subsystem 80''' that is used multiple times.

Using by way of example, the embodiment of FIGS. 11-12, the model 70' can comprise four disembodied wheel and tire assemblies ("DWT") that are substantially similar to each other and when used in a hybrid dynamic system comprising a physical vehicle 80' may have no substantial cross-coupled inputs and outputs; thus each "corner" of the vehicle, or each model DWT has the same virtual dynamic response, herein exemplified as one example as having the same FRF. This is illustrated in FIG. 15 by method 300 where a virtual FRF 302 is obtained using a model 304 of a tire and wheel assembly. In particular, a random drive 305 is applied to the model 304 to obtain a modeled random response 306. The virtual subsystem dynamic response (e.g. FRF) 302 can then be obtained using the random drive 305 and the modeled random response 306. Since in this embodiment, it is assumed that each corner of the model behaves the same, a combined virtual dynamic response for all subsystems 310 for all four corners can be obtained, where the virtual subsystem dynamic response 302 is repeated along the diagonal of the combined virtual dynamic response for all subsystems 310 since cross-coupling is considered non-existent.

A physical dynamic response for the physical system 80' is obtained by method 320. In particular, random drives 322 are applied to the physical system 80' to obtain a first set of "coupling" random responses 324 (similar to responses 82' in FIG. 11) and a second set "convergence" random responses 326 (similar to responses 84' in FIG. 11). A first dynamic response model (e.g. FRF) 328 is obtained using the random drives 322 and the first set of coupling random responses 320, while a second dynamic response model (e.g.

FRF) 330 is obtained using the random drives 322 and the second set of convergence random responses 326. Multiplying the combined virtual dynamic response for all subsystems 310 with the first dynamic response model 328 using a processor realizes a dynamic response matrix at 332 that when combined with the second dynamic response model 330 by summer 334 yields the system dynamic response model 76'.

The procedure illustrated in FIG. 15 can save significant processing time. For instance if the random drive 304 comprises 100 seconds of time, it may take the processor 30 minutes to realize the modeled random response 306. In this example, it is assumed 800 seconds of the random drives 322 is applied to the physical system 80' with the test rig 72' to obtain the sets of responses of which as discussed above are then used to realize the system dynamic response model 76'. By comparison if the 800 seconds of random drives 322 were applied to the vehicle 80' using the procedure described above with respect to FIG. 11 where a more complex model 70' comprising each of the corners being modeled separately, it may take a processor 20 hours to compute the random model responses 86' in order to possibly yield the same or substantially the same system dynamic response 76'. Of course the processing time indicated above is merely illustrative and should not be considered limiting.

As indicated above the procedure illustrated in FIG. 15 can be applied to the embodiments of FIGS. 13 and 14. Depending on the accuracy desired this may or may not be sufficient as applied to a model of a vehicle 70" (less the physical systems), but again it should be noted that use of aspects of the present invention are not limited to applications involving vehicles or parts thereof, but rather to all types of hybrid dynamic systems. In yet a further method of processing for the embodiments of FIGS. 13 and 14 using the procedure of FIG. 15 methods 300 and 320 can be switched. In particular, method 320 comprising driving corresponding test rig 72" to obtain decoupled "coupling" and "convergence" FRFs (each similar to 310). For the embodiment of FIG. 14 the same decoupled "coupling" and "convergence" FRFs are obtained by driving the test rig 72''' once and assuming each behaves the same way. The random drives for the model 70" is then played once to obtain the associated virtual dynamic response 302 and again using matrix mathematical processing the same system dynamic response can be obtained as that directly obtained using the embodiments of FIGS. 13 and 14. In this case though, significant processing time savings may not be realized since the virtual vehicle model 70" of the complementary system is probably more complex than the individual virtual tire and wheel assembly 70' of FIGS. 11 and 12.

Although the subject matter has been described in language specific to structural features and/or methodological acts, it is to be understood that the subject matter defined in the appended claims is not necessarily limited to the specific features or acts described above as has been determined by the courts. Rather, the specific features and acts described above are disclosed as example forms of implementing the claims.

What is claimed is:

1. An arrangement for controlling a coupled hybrid dynamic system comprising modeled components in a virtual model and physical components, the arrangement comprising:
    a physical test rig configured to drive the physical structural components and generate a test rig response comprising a coupling response corresponding to an input to the virtual model and a convergence response that is compared to an output of the virtual model;
    a storage device; and
    a processor operable with the storage device to store a virtual model of a complementary system to the physical structural components, the virtual model comprising a model of a disembodied assembly, the processor configured to:
        obtain a virtual dynamic response of the virtual model of the disembodied assembly;
        obtain a combined virtual dynamic response for a plurality of disembodied assemblies using the virtual dynamic response for the disembodied assembly; and
        obtain the system dynamic response model using the combined virtual dynamic response, the coupling response and the convergence response.

2. The arrangement of claim 1 wherein processor is configured to obtain the combined virtual dynamic response by using the virtual dynamic response for the disembodied assembly repeatedly for each disembodied assembly of the plurality of disembodied assemblies.

3. The arrangement of claim 1 wherein the processor wherein the processor is configured to:
    obtain a first dynamic response using the drive of the physical structural components and the coupling response;
    obtain a second dynamic response using the drive of the physical structural components and the convergence response
    obtain a dynamic response matrix using the combined virtual dynamic response for the plurality of disembodied assemblies and the first dynamic response; and
    obtain the system dynamic response model using the dynamic response matrix and the second dynamic response.

4. A method of controlling a coupled hybrid dynamic system comprising modeled components in a virtual model and physical components, the virtual model being a complementary system to the physical structural components, the virtual model comprising a model of a disembodied assembly the method comprising:
    controlling a physical test rig to drive the physical structural components and generate a test rig response comprising a coupling response corresponding to an input to the virtual model and a convergence response that is compared to an output of the virtual model, and
    applying a virtual drive to the model of the disembodied assembly using a processor and obtain a virtual model response;
    obtaining a virtual dynamic response for the disembodied assembly using the virtual drive applied to the model of the disembodied assembly and the virtual model response;
    obtaining a combined virtual dynamic response for the plurality of disembodied assemblies using the virtual dynamic response for the disembodied assembly repeatedly in the virtual dynamic response for the plurality of disembodied assemblies;
    obtaining a first dynamic response using the drive of the physical structural components and the coupling response;
    obtaining a second dynamic response using the drive of the physical structural components and the convergence response;

obtaining a dynamic response matrix using the combined virtual dynamic response for the plurality of disembodied assemblies and the first dynamic response; and obtaining the system dynamic response model using the dynamic response matrix and the second dynamic response.

\* \* \* \* \*